(12) United States Patent
Yonezawa

(10) Patent No.: US 6,949,745 B2
(45) Date of Patent: Sep. 27, 2005

(54) ELECTRON BEAM APPARATUS

(75) Inventor: Akira Yonezawa, Chiba (JP)

(73) Assignee: SII NanoTechnology Inc., Chiba (JP)

(*) Notice: Subject to any disclaimer, the term of this patent is extended or adjusted under 35 U.S.C. 154(b) by 0 days.

(21) Appl. No.: 10/438,145

(22) Filed: May 14, 2003

(65) Prior Publication Data

US 2003/0230714 A1 Dec. 18, 2003

(30) Foreign Application Priority Data

May 15, 2002 (JP) ........................................ 2002-140121

(51) Int. Cl.$^7$ ............................. G21K 7/00; G01K 1/08
(52) U.S. Cl. .................... 250/311; 250/310; 250/396 R
(58) Field of Search ................................ 250/310, 311, 250/396 R

(56) References Cited

U.S. PATENT DOCUMENTS

| | | | | | |
|---|---|---|---|---|---|
| 4,426,577 A | * | 1/1984 | Koike et al. | ................. | 250/310 |
| 4,437,009 A | * | 3/1984 | Yamazaki | ............ | 250/396 ML |
| 4,808,821 A | * | 2/1989 | Feuerbaum et al. | ........ | 250/305 |
| 4,818,874 A | * | 4/1989 | Ishikawa | .................... | 250/310 |
| 4,893,009 A | * | 1/1990 | Kuroda | ........................ | 250/310 |
| 4,922,097 A | * | 5/1990 | Todokoro et al. | ............ | 250/310 |
| 5,300,880 A | * | 4/1994 | Okubo et al. | ................ | 324/751 |
| 5,412,210 A | * | 5/1995 | Todokoro et al. | ........... | 250/310 |
| 5,608,218 A | * | 3/1997 | Sato et al. | ................... | 250/310 |
| 5,731,580 A | * | 3/1998 | Sato et al. | ................... | 250/310 |
| 5,872,358 A | * | 2/1999 | Todokoro et al. | ............ | 250/310 |
| 5,894,124 A | * | 4/1999 | Iwabuchi et al. | ............ | 250/310 |
| 5,939,720 A | * | 8/1999 | Todokoro | .................... | 250/310 |
| 5,981,947 A | * | 11/1999 | Nakasuji et al. | ............. | 250/310 |
| 6,037,589 A | * | 3/2000 | Yonezawa et al. | ........... | 250/310 |
| 6,043,491 A | * | 3/2000 | Ose et al. | .................... | 250/310 |
| 6,172,363 B1 | * | 1/2001 | Shinada et al. | ............. | 250/310 |
| 6,555,819 B1 | * | 4/2003 | Suzuki et al. | ................ | 250/311 |
| 6,580,074 B1 | * | 6/2003 | Sato et al. | ................... | 250/310 |
| 6,600,156 B2 | * | 7/2003 | Kazumori | .................... | 250/310 |
| 6,646,262 B1 | * | 11/2003 | Todokoro et al. | ............ | 250/310 |

\* cited by examiner

*Primary Examiner*—John R. Lee
*Assistant Examiner*—Kalimah Fernandez
(74) *Attorney, Agent, or Firm*—Adams & Wilks

(57) ABSTRACT

An electron beam apparatus has an optical axis, an electron beam source for generating an electron beam directed along the optical axis, and a magnetic field lens having an axis coincident with the optical axis for focusing the electron beam onto a sample which is subjected to a negative voltage so that secondary electrons are emitted from the sample. The magnetic field lens has a conductive cylinder surrounding a part of the optical axis to permit the passage therethrough of an electron beam from the electron beam source. A first detector detects secondary electrons emitted by the sample in a direction away from the optical axis and is disposed at a position generally confronting the conductive cylinder. A second detector is disposed over the conductive cylinder. A Wien filter deflector deflects secondary electrons emitted by the sample toward and for detection by the second detector. The Wien filter deflector is disposed on the optical axis and between the conductive cylinder and the second detector.

4 Claims, 6 Drawing Sheets

ELECTRON BEAM APPARATUS

BACKGROUND OF THE INVENTION

1. Field of the Invention

The present invention relates to an electron beam apparatus.

2. Description of Related Art

In order to perform inspection or observation of the shape of a fine pattern electronic device, conventionally various electron beam devices, such as a scanning electron microscope, have been used. In particular, there has been a high demand for high resolution observation accompanying the fact that electronic devices have become ultrafine in recent years. With this type of electron beam device capable of high-resolution observation, there are cases where a potential is applied to a sample in order to increase image quality at low accelerating voltages. Therefore, when a potential Vs is applied to a sample, secondary electrons then have substantially the energy Vs and the proportion of secondary electrons on the electron source side traveling in a straight line along the optical axis is therefore high. As a result, there is a problem where the efficiency with which secondary electrons are detected falls. This tendency is therefore particularly strong for electrons coming from the bottoms of holes in a semiconductor wafer.

In order to resolve this problem, in Japanese Laid-open Patent Publication No. Hei. 5-258703, there is disclosed an electron beam scanning method and system thereof that deflects secondary electrons using a Wien filter so as to detect secondary electrons while reducing the effect on incident electrons. At the Wien filter, the electric field and the magnetic field are arranged so as to be orthogonal with respect to each other. Of the force acting on electrons incident in a direction from the electron gun towards the sample, force due to the electric field is $-eE$, and force due to the magnetic field is $-e(v \times B)$ constituting the vector sum. The forces acting on the incident electrons when these forces are equal are therefore balanced and incident electrons are therefore not deflected. However, the direction of travel of secondary electrons coming from the sample is opposite to the direction of incident electrons with respect to the Wien filter. The direction of force due to the magnetic field is therefore opposite to that of the incident electrons. The forces of the electric field and the magnetic field therefore act on the secondary electrons in the same direction and therefore only the secondary electrons are deflected.

In addition to the methods proposed in Japanese Laid-open Patent Publication Hei. 5-258703, methods are proposed in Japanese Patent Publication No. 3136353 and Japanese Laid-open Patent publication No. Hei. 10-214586 where a plurality of secondary electron detectors are provided along the direction of the optical axis, with the sum of a plurality of detector signals then being used to improve the efficiency with which secondary electrons are detected.

However, in the invention disclosed in Japanese Laid-open Patent Publication Hei. 5-258703, the secondary electron detector is installed away from the beam that is on the optical axis. It is therefore necessary to deflect secondary electrons through an angle greater than that of a detection surface of a following scattered electron detector using two deflectors functioning as a Wien filter in order to detect the secondary electrons. The intensity of the electromagnetic field of the Wien filter is therefore large, and the influence of Wien filter aberrations on the beam therefore easily becomes large which can easily prove detrimental to image resolution.

Further, a large apparatus capable of generating a large electromagnetic field for the deflectors functioning as the Wien filter is required in order to deflect the secondary electrons through a large angle. In addition to making the apparatus manufacturing costs high, this also makes the electron beam apparatus as a whole large, which results in an expensive product.

With the invention disclosed in Japanese Patent No. 3136353, the secondary electrons pass through the hole in the upper side detector meaning that there are secondary electrons that are not detected at the upper side detector. This means that detection efficiency is not sufficient. Further, a deflector is provided in order to perform beam scanning on the sample surface but the amount of secondary electrons deflected depends on the strength of the deflector and there is therefore a further problem in that it is easy for the center of the screen to become dark.

In the invention proposed in Japanese Laid-open Patent Publication No. 10-214586, the electron-gun-side axis and the objective lens axis are separated just by a prescribed distance. When this prescribed distance is fixed, the intensity of the beam deflector is fixed because the electron gun axis and the objective lens axis are in line with each other. It has therefore been difficult to set the strength of the deflectors appropriately so as to obtain a sufficient secondary electron signal. There is also a further problem of inconvenience in that this is detrimental to flexibility during lens barrel adjustment. On the other hand, a mechanism for, for example, moving the electron gun axis horizontally etc. is required when it is wished to vary a prescribed distance between the electron gun-side axis and the objective lens axis. This makes the structure of the electron beam apparatus complex, causes the manufacturing cost of the apparatus to rise, and makes the operation of the electron beam apparatus complex.

A secondary electron detector having a hole allowing a beam to pass is used as a secondary electron detector and a Micro Channel Plate (MCP) is given as this kind of detector. However, MCPs have a short lifespan compared to the scintillator/photo-multiplier detectors usually used and are therefore expensive. In the case where a secondary detector having a hole allowing this beam to pass is used as the second detector, the secondary electrons are incident to the detection surface in the shape of a spot and there is the fear that this will cause the detection surface to deteriorate rapidly.

Further, a secondary electron detector having a hole allowing a beam to pass encompasses the detection electrode to which the negative potential is applied at the inside of the hole. There are therefore parts between the detection surface and the electrode where detection cannot be achieved. In particular, it is necessary to make the strength of the beam deflector substantial in order to surpass portions that cannot detect and deflect the beam as far as the detection surface. There is therefore the problem that deflection aberrations are increased and image resolution is caused to deteriorate.

SUMMARY OF THE INVENTION

In order to resolve the aforementioned problems, according to the present invention, there is provided an electron beam apparatus equipped with a magnetic field lens arranged on the same axis as an optical axis and configured in such a manner that an electron beam from an electron beam source advancing along the optical axis and being incident to the magnetic field lens focused onto a sample subjected to a negative voltage, with electrons emitted from the sample as a result of the sample being irradiated with the electron beam being detected, wherein a conductive cylinder is arranged so as to cover part of the optical axis in such a manner as to permit the passage of an electron beam from the electron beam source, and, a first detector for detecting emitted electrons of the emitted electrons that do not pass through the cylinder; a second detector for detecting emitted electrons of the emitted electrons that do pass through the cylinder; and a Wien filter deflector for increasing the emitted electrons detected by the second detector for emitted electrons that pass through the cylinder, provided between the cylinder and the second detector; are provided within the magnetic field lens.

According to the present invention, at least one of the first detector or the second detector is a scintillator detector, and there is provided a reflecting plate positioned further to the side of the electron beam source than the cylinder at the outside of the cylinder.

According to the present invention, an electron beam apparatus is provided where a negative voltage is applied to the cylinder and the reflecting plate, or only to the reflecting plate.

According to the present invention, there is provided an electron beam apparatus where the voltage applied to the cylinder and the reflecting plate, or only to the reflecting plate is the same voltage as is applied to the sample or is a larger negative voltage.

According to the present invention, detection signals outputted from the first detector and the second detector may be composite signals.

According to the present invention, there is provided an electron beam apparatus where the first detector is comprised of a plurality of detectors, with it being possible for each of the plurality of detectors to independently detect each detected signal and form composite signals.

According to the present invention, an electron beam apparatus is provided where the first detector may comprise a plurality of scintillator detectors.

According to the present invention, there is provided an electron beam apparatus equipped with a magnetic field lens arranged on the same axis as an optical axis and configured in such a manner that an electron beam from an electron beam source advancing along the optical axis and being incident to the magnetic field lens is focused onto a sample subjected to a negative voltage, with electrons emitted from the sample as a result of the sample being irradiated with the electron beam being detected, wherein, using a two-stage deflection system, an electron beam coming from the electron beam source is made incident in such a manner as to be inclined with respect to the optical axis by a deflector comprising a magnetic field or an electro-magnetic field, the electron beam is made incident to the electromagnetic field lens after being deflected by the deflector, emitted electrons emitted from the sample and passing through the magnetic field lens are detected by the first detector, and emitted electrons not detected by the first detector are deflected by the deflector so as to be detected by the second detector.

According to the present invention, at least one of the first detector or the second detector is a scintillator detector, and there is provided a reflecting plate positioned further to the side of the electron beam gun than the cylinder at the outside of the cylinder.

According to the present invention, an electron beam apparatus is provided where a negative voltage is applied to the cylinder and the reflecting plate, or only to the reflecting plate.

According to the present invention, there is provided an electron beam apparatus where the negative voltage applied to the cylinder and the reflecting plate, or only to the reflecting plate is the same voltage as is applied to the sample or is a larger negative voltage.

According to the present invention, detection signals outputted from the first detector and the second detector may be composite signals.

According to the present invention, there is provided an electron beam device where the first detector is comprised of a plurality of detectors, with it being possible for each of the plurality of detectors to independently detect each detected signal and form composite signals.

According to the present invention, an electron beam apparatus is provided where the first detector may comprise a plurality of scintillator detectors.

DETAILED DESCRIPTION OF THE PREFERRED EMBODIMENTS

Embodiments of the present invention will be described in more detail below with reference to the drawings.

Figure 1:
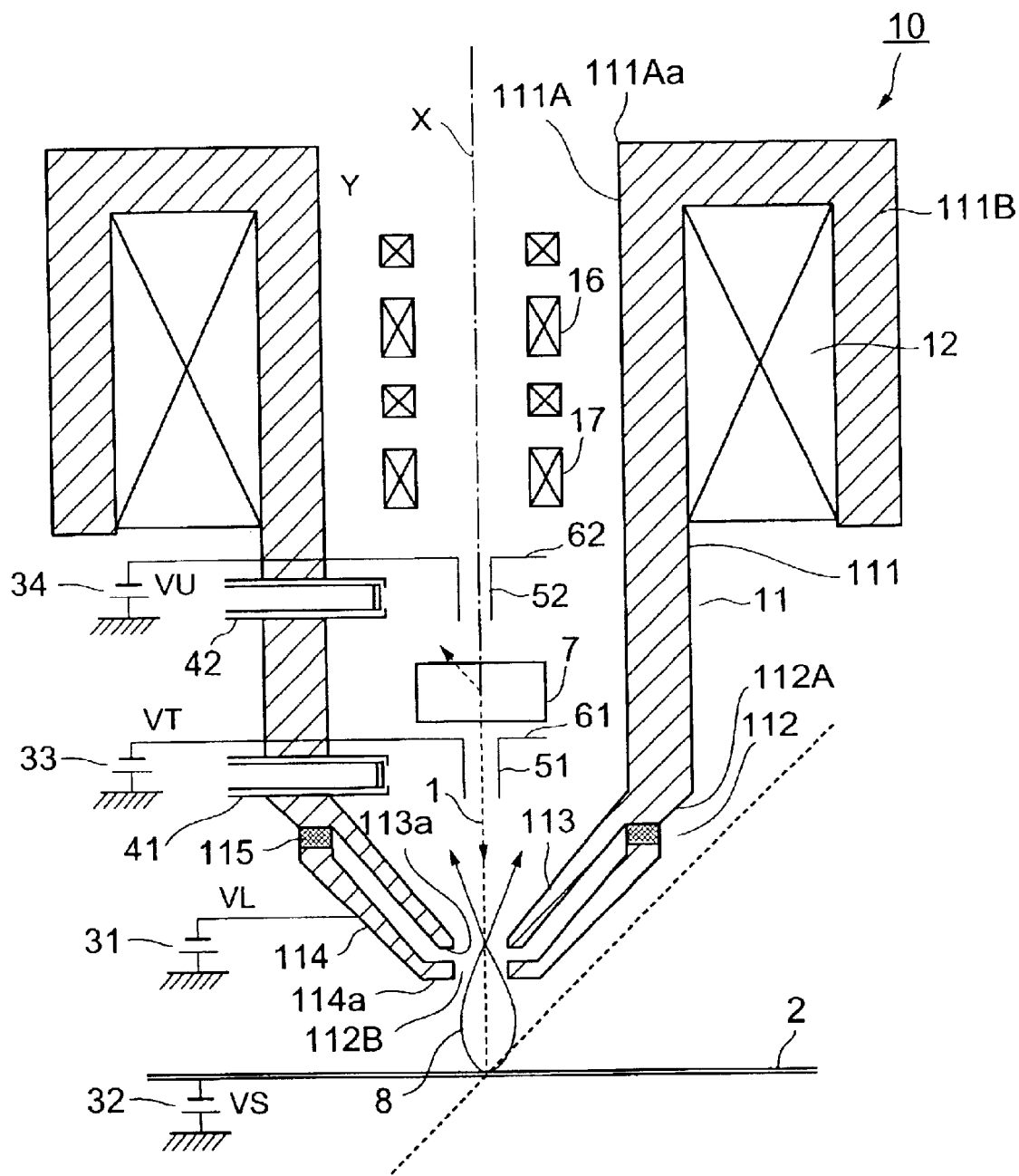
FIG. 1 is a cross-sectional view of an example of an embodiment of a single pole-piece lens with an electrostatic bipotential lens of the present invention provided in an electron beam apparatus (not shown).

FIG. 1 is a cross-sectional view of an example of an embodiment of a single pole-piece lens with an electrostatic bipotential lens 10 of the present invention provided in an electron beam apparatus (not shown) . The single pole-piece lens with an electrostatic bipotential lens 10 is configured as an objective lens of the electronic apparatus, such as a scanning electron microscope apparatus, used in scanning and observation of the shapes of fine pattern electronic devices, and subjects an electron beam 1 advancing along an optical axis X from an electron gun (not shown) to the focusing action of a magnetic field and superimposes a decelerating electric field with the magnetic field so as to reduce the chromatic aberration coefficient of the lens in order to provide an electrostatic magnetic objective lens capable of narrowly focusing the electron beam 1 onto the sample 2 so as to enable observation of high-resolution images.

The single pole-piece lens with an electrostatic bipotential lens 10 is formed with an excitation coil 12 provided at a magnetic circuit 11, with the magnetic circuit 11 being formed integrally with a yoke 111 and magnetic pole 112. The yoke 111 is provided at the side of advancing of the electron beam 1 advancing along the direction of the optical axis X. An overhanging portion 111B L-shaped in cross-section is integrally formed so as to extend radially outwards at an end edge 111a of a cylindrical body 111A forming a cylindrical path Y through-which the electron beam 1 passes. The excitation coil 12 is housed within an annular space formed by the body 111A and the overhanging portion 111B.

On the other hand, the magnetic pole 112 is formed as a truncated pot-shape, with a large diameter opening edge 112A constituting one end of the magnetic pole 112 being fixed to the body 111A of the yoke 111. The magnetic pole 112 is partitioned into an upper magnetic pole 113 far away from the sample 2 and a lower magnetic pole 114 close to the sample 2. The two magnetic poles 113 and 114 are then connected via an insulator 115 that is an electrically insulating material.

The insulator 115 is a cylindrical member corresponding to the dimensional shape of the large diameter opening edge 112A of the magnetic pole 112, with the lower magnetic pole 114 being formed integrally with the large diameter opening edge 112A of the magnetic pole 112 via the insulator 115. The top surface 113a of the upper magnetic pole 113 is configured so as to be positioned closer to the sample 2 than the insulator 115 provided between the upper magnetic pole 113 and the lower magnetic pole 114. A through-hole 112B for allowing the electron beam 1 to pass is therefore provided on the same axis as the optical axis X by the top surface 113a of the upper magnetic pole 113 and a top surface 114a of the lower magnetic pole 114.

A magnetic field for focusing can therefore be formed within the path Y when a current flows in the excitation coil 12 because the single pole-piece lens with an electrostatic bipotential lens 10 is configured in the above manner. An electron beam 1 advancing towards the single pole-piece lens with an electrostatic bipotential lens 10 along the optical axis X from an electron gun (not shown) constituting an electron beam source can therefore be subjected to focusing action due to the magnetic field when passing through the path Y.

A negative potential VL (for example, −1 kV) is applied by a high-voltage supply 31 to the lower magnetic pole 114 and a negative potential VS (for example, −1 kV) is applied by a high-voltage supply 32 to the sample 2. A decelerating electric field can therefore be generated between the upper magnetic pole 113 and the lower magnetic pole 114 and it is therefore possible to superimpose this decelerating electric field on the focusing magnetic field due to the single pole-piece lens with an electrostatic bipotential lens 10.

In order to detect secondary electrons that are electrons emitted from the sample 2 due to the electron beam 1 approaching the single pole-piece lens with an electrostatic bipotential lens 10 along the optical axis X, first and second detectors 41 and 42 are provided at upper and lower stages at the yoke 111 of the single pole-piece lens with an electrostatic bipotential lens 10. The first detector 41 is provided at the lower part, and a hollow first cylinder 51 encompassing part of the optical axis X is provided at the optical axis X of the first detector 41. A hollow second cylinder 52 encompassing part of the optical axis X is also similarly provided at the optical axis X of the second detector 42.

A donut-shaped first reflecting plate 61 is provided perpendicularly with respect to the optical axis X at the upper end of the first cylinder 51 and a donut-shaped second reflecting plate 62 is also provided perpendicularly with respect to the optical axis at the upper end of the second cylinder 52. A negative potential VT is applied to the first cylinder 51 and first reflecting plate 61 by a high-voltage power supply 33 and a negative potential VU is applied to the second cylinder 52 and the second reflecting plate 62 by a high-voltage power supply 34.

A Wien filter 7 constituting a deflector is provided between the first reflecting plate 61 and the second reflecting plate 62 so that the center of the Wien filter 7 overlaps with the optical axis X. When the forces due to the electric field and the magnetic field acting on incident electrons are equal, i.e. when $E=u \times B$ or $E/B=u$, the incident electrons are not deflected. These are Wien conditions, and a deflector utilizing these conditions is a Wien filter.

The single pole-piece lens with an electrostatic bipotential lens 10 has the configuration described above. After passing through the space within the second cylinder 52, the Wien filter 7, and the space within the first cylinder 51 in that order, the electron beam 1 incident along the optical axis X coming from the electron gun (not shown) is focused so as to be incident to the sample 2 due to the action of the magnetic field formed in the vicinity of the top surface 114a of the single pole-piece lens with an electrostatic bipotential lens 10. The electron beam 1 is made to scan the sample 2 by the scanning deflectors 16 and 17 but in FIG. 1, the strength of the scanning deflectors 16 and 17 is zero, i.e. the electron beam irradiates a point corresponding to the center of the screen.

Figure 2:
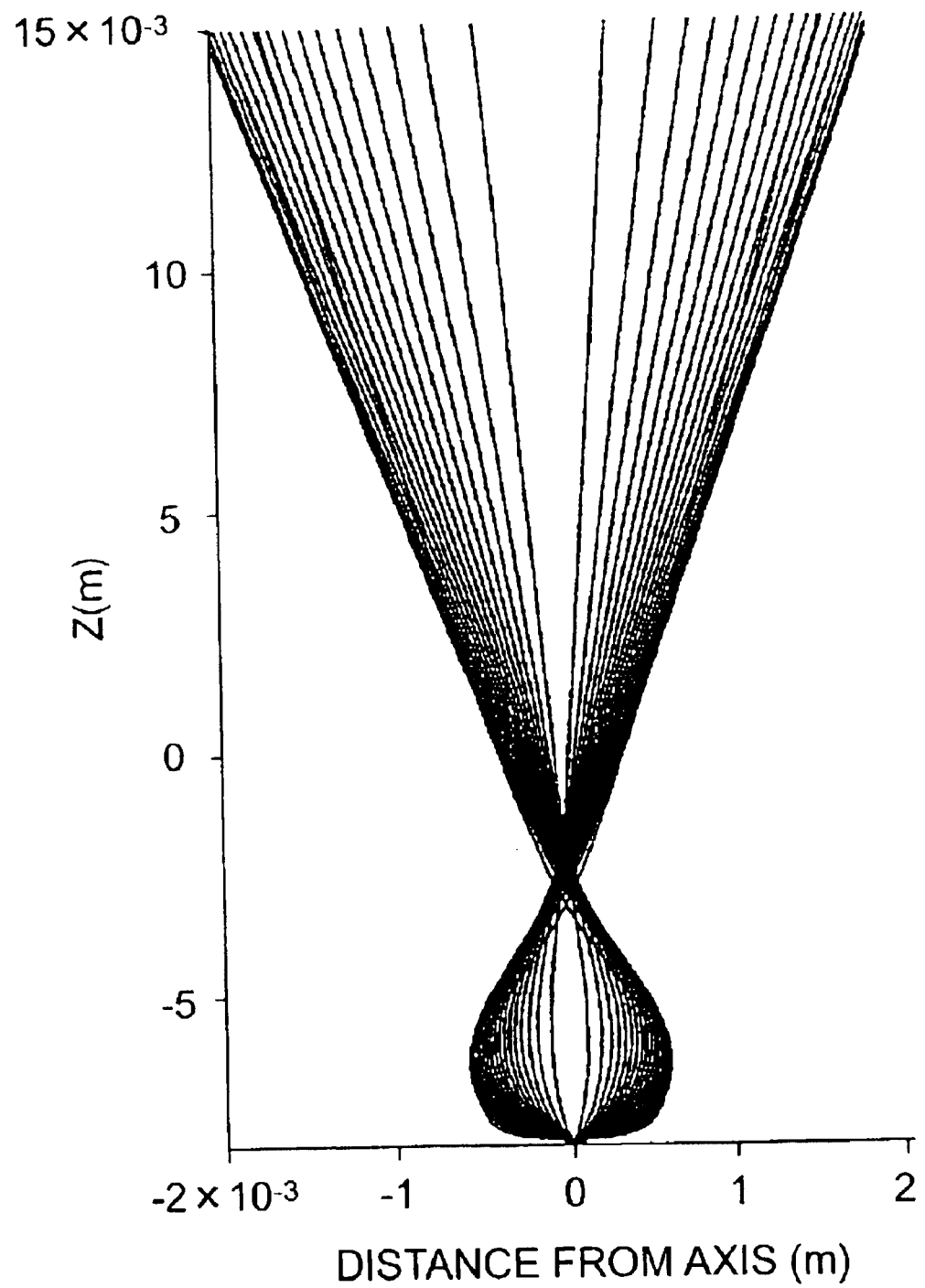
FIG. 2 shows an example of the trajectory of the secondary electrons coming from the sample.

An example of the trajectory of the secondary electrons 8 coming from the sample 2 is shown in FIG. 2. Some of the secondary electrons 8 collide with the first reflecting plate 61 and secondary electrons 8 emitted from the first reflecting plate 61 are detected by the first detector 41. Secondary electrons 8 passing through the first cylinder 51 are deflected in the direction of the arrow as shown by the dotted line by the Wien filter 7 and are detected by the second detector 42. Further, some of the secondary electrons 8 deflected by the Wien filter 7 collide with the second reflecting plate 62 and secondary electrons 8 emitted from the second reflecting plate 62 are detected by the second detector 42.

When the amount of current of the incident electron beam 1 is large, the amount of secondary electrons emitted from the sample 2 becomes large and drops in the number of secondary electrons 8 due to dirt on the first and second reflecting plates 61 and 62 can no longer be ignored. However, the trajectory of the secondary electrons 8 can be changed by applying a negative voltage to the first and second cylinders 51 and 52 and the first and second reflecting plates 61 and 62 using the high-voltage power supplies 33 and 34.

For example, when a voltage of −1 kV that is the same as the sample potential and is taken as the negative potential VT and a potential of −1 kV taken as the negative potential VU are applied to the first cylinder 51 and the first reflecting plate 61, secondary electrons 8 emitted from the sample can be detected by the first detector 41 without hardly colliding with the first cylinder 51 and the first reflecting plate 61. Namely, if a negative voltage that is the same as or larger than the voltage applied to the sample is applied to the first and second cylinders 51 and 52 and the first and second reflecting plates 61 and 62, collisions of the secondary electrons 8 with the first and second reflecting plates 61 and 62 can be prevented and soiling of the first and second reflecting plates 61 and 62 can also be prevented.

Figure 3:
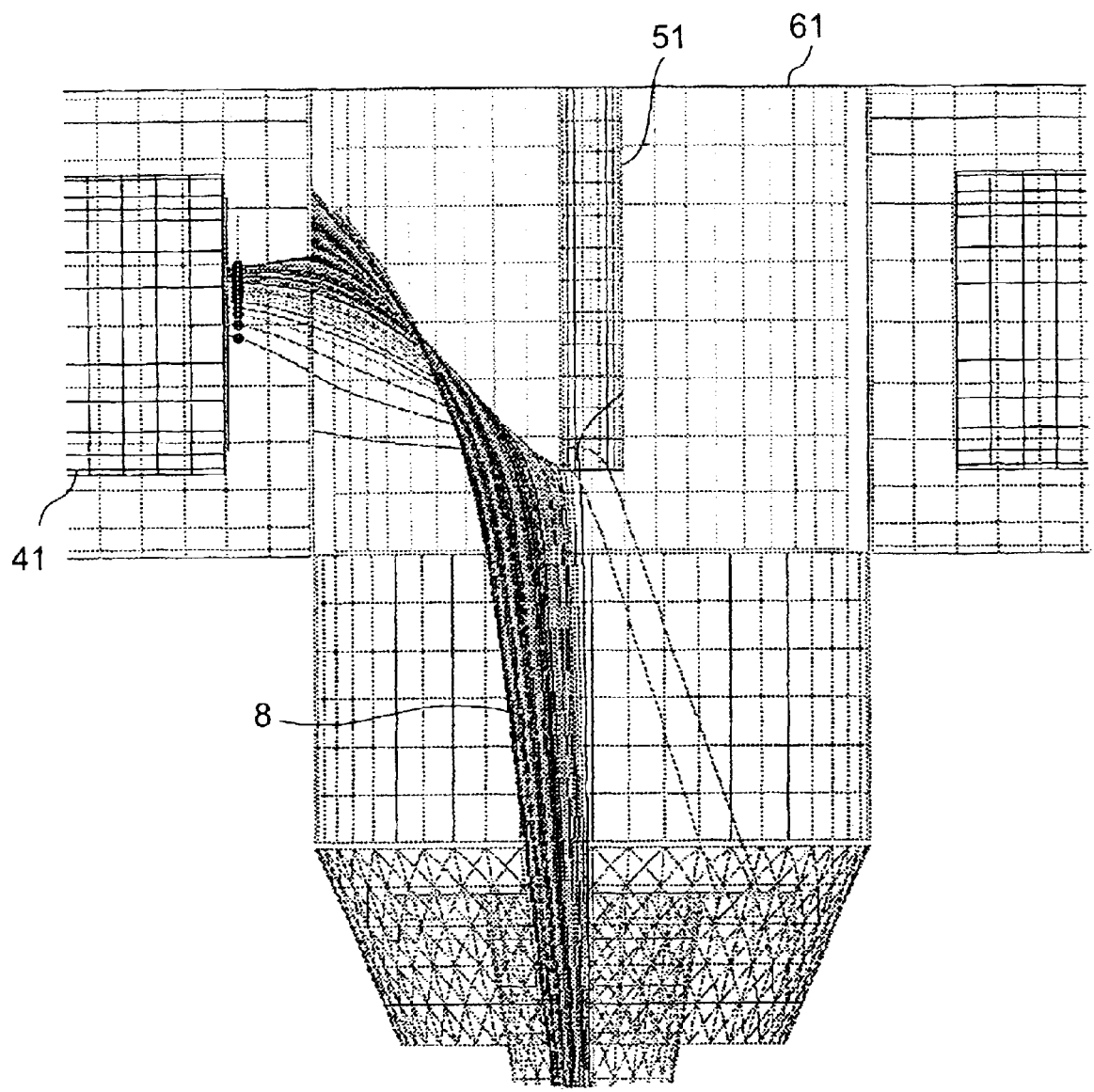
FIG. 3 is a graph showing results for example trajectories calculated for secondary electrons when respective negative potentials are applied to the first cylinder and the first reflecting plate.

A graph is shown in FIG. 3 of example calculated trajectories for the case when a negative potential VT of −1 kV and a negative potential VU of −1 kV are applied to the first cylinder 51 and the first reflecting plate 61, respectively. According to the graph shown in FIG. 3, it can be seen that secondary electrons 8 out putted from the sample 2 are detected by the first detector 41 without hardly colliding with the first cylinder 51 and the first reflecting plate 61 at all.

If the diameters of the first and second cylinders 51 and 52 are therefore small at around 2 to 3 mm, most of the secondary electrons 8 can be made to face the first detector 41 and the second detector 42 by the first and second reflecting plates 61 and 62. The force required to deflect the secondary electrons 8 using the Wien filter 7 can therefore be made small, i.e. the electromagnetic field strength of the Wien filter 7 can be made small. In this way, the influence on the incident electron beam 1 can be made small and lowering of the image resolution can be prevented. It is therefore possible to achieve sufficient angular deflection of the secondary electrons 8 by applying negative voltages to the first and second cylinders 51 and 52 and the first and second reflecting plates 61 and 62. It is also possible to prevent the first and second reflecting plates 61 and 62 from becoming soiled and therefore improve detection efficiency.

Figure 4:
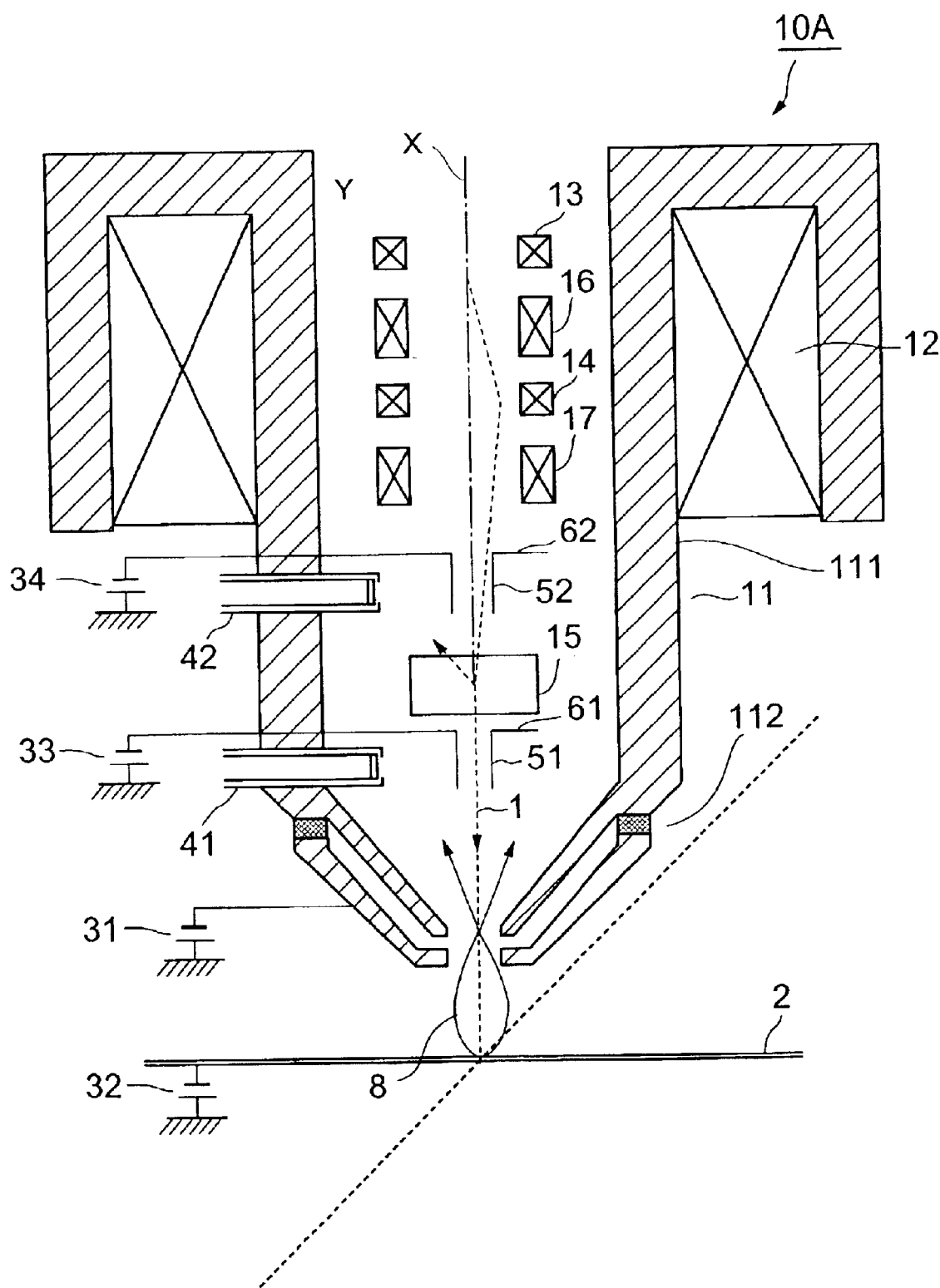
FIG. 4 is a cross-sectional view of a further embodiment of a single pole-piece lens with an electrostatic bipotential lens of the present invention.

FIG. 4 is a cross-sectional view of a further embodiment of a single pole-piece lens with an electrostatic bipotential lens of the present invention. At a single pole-piece lens with an electrostatic bipotential lens 10A shown in FIG. 4, an electron beam 1 from an electron gun (not shown) is deflected by deflector 13 of the deflectors 13 and 14 located at the two upper and lower stages and differs from the single pole-piece lens with an electrostatic bipotential lens 10 shown in FIG. 1 in that the electron beam 1 is incident to the deflector 15 constructed from a magnetic field or electromagnetic field at an angle with respect to the optical axis due to the deflector 14. The same numerals are used for the sections in FIG. 4, that correspond to those in FIG. 1, and the descriptions for those sections are omitted.

Here, the strength of the scanning deflectors 16 and 17 is zero, i.e. the electron beam is an electron beam irradiating a point at the center of the screen. Further, the deflector 15 is only configured using a magnetic field but is by no means limited in this respect and may also be constructed from an electromagnetic field or a Wien filter.

The electron beam 1 incident to the deflector 15 is deflected by the deflector 15 and is incident to the sample 2 along the optical axis X. The secondary electrons 8 from the sample 2 are detected as shown in the case in FIG. 1. The deflector 15 is only configured from a magnetic field rather than an electric field but in this case also, as in the case shown in FIG. 1, the secondary electrons 8 are subjected to a force in a direction opposite to that of the incident electron beam 1, are deflected in the direction of the first detector 41 and are detected by the first detector 41. Secondary electrons 8 passing through the first cylinder 51 are then deflected in the direction of the second detector 42 and are detected by the second detector 42.

In this embodiment, as the strength of the force E due to the electric field and the force B due to the magnetic field is not that of the existing Wien conditions, the incident electron beam 1 is deflected within the path Y of the single pole-piece lens with an electrostatic bipotential lens 10. The electron beam 1 passing through the deflector 15 is therefore incident in a manner perpendicular to the objective lens and it is necessary for the electron beam 1 to be incident to the deflector 15 after being deflected by a deflector provided above the deflector 15. In the case of a configuration where an electron beam 1 is deflected by a deflector provided at the upper part taken as one stage so as to be incident to the deflector 15, it is necessary to offset the electron gun axis and the objective lens axis in advance. The configuration of the single pole-piece lens with an electrostatic bipotential lens 10A and the operation of offsetting the axes in advance are therefore both complex. In this embodiment, after the electron beam 1 is deflected by the second stage deflectors 13 and 14, the electron beam 1 is incident to the deflector 15. It is therefore not necessary to perform the operation of offsetting the axes and the configuration and operation of the single pole-piece lens with an electrostatic bipotential lens 10A can therefore be simplified.

Here, when E/B=v/2, compared with conditions for the deflection angle of the secondary electrons 8 that are the same as the case of Wien filter conditions, picture quality is better than in the case for Wien conditions. Further, when E/B=0, i.e. in the case of a deflector using only magnetic field force with the force of the electric field at zero, as with the case of E/B=v/2, better picture quality is obtained than for under the Wien conditions.

In this embodiment, deflectors 13 and 14 are provided in addition to the scanning deflectors 16 and 17. However, the deflectors 13 and 14 can be omitted by superimposing the deflection due to the deflectors 13 and 14 with that of the scanning deflectors 16 and 17.

Figure 5:
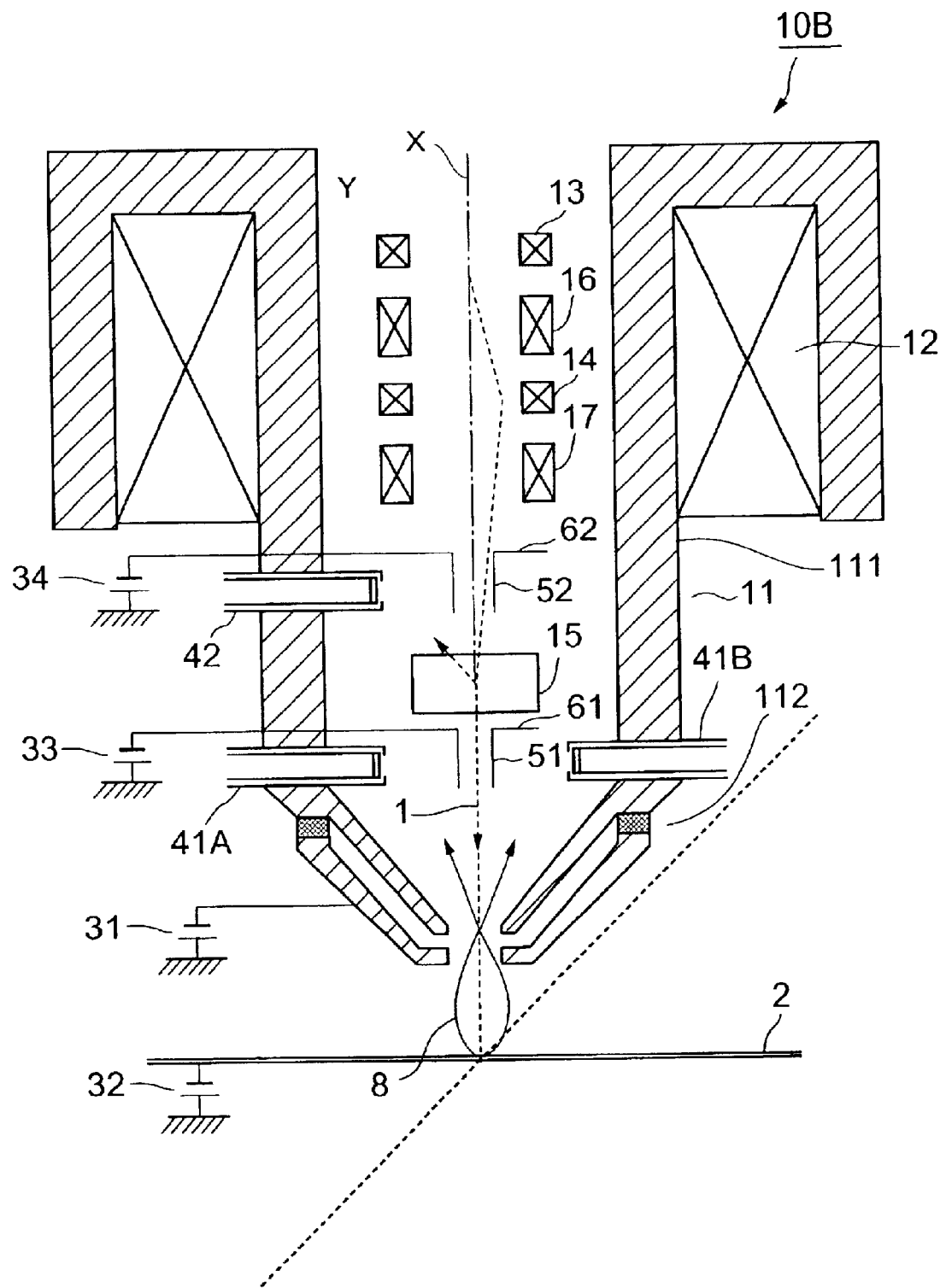
FIG. 5 is a cross-sectional view of a still further embodiment of a single pole-piece lens with an electrostatic bipotential lens of the present invention.

FIG. 5 shows a still further embodiment of a single pole-piece lens with an electrostatic bipotential lens of the present invention. A single pole-piece lens with an electrostatic bipotential lens 10B shown in FIG. 5 differs from the single pole-piece lens with an electrostatic bipotential lens 10A shown in FIG. 4 in that two scintillator detectors 41A and 41B are provided on axes symmetrical to the optical axis X in place of the first detector 41 (refer to FIG. 4). Signals from the two scintillator detectors 41A and 41B are then synthesized. The same numerals are used for the sections in FIG. 5, that correspond to those in FIG. 4, and the descriptions for those sections are omitted.

According to this embodiment, a surface image emphasized for unevenness can be obtained even for in-lens SEM with the sample 2 being placed within a strong lens magnetic field because signals from the two scintillator detectors 41A and 41B are synthesized.

Figure 6:
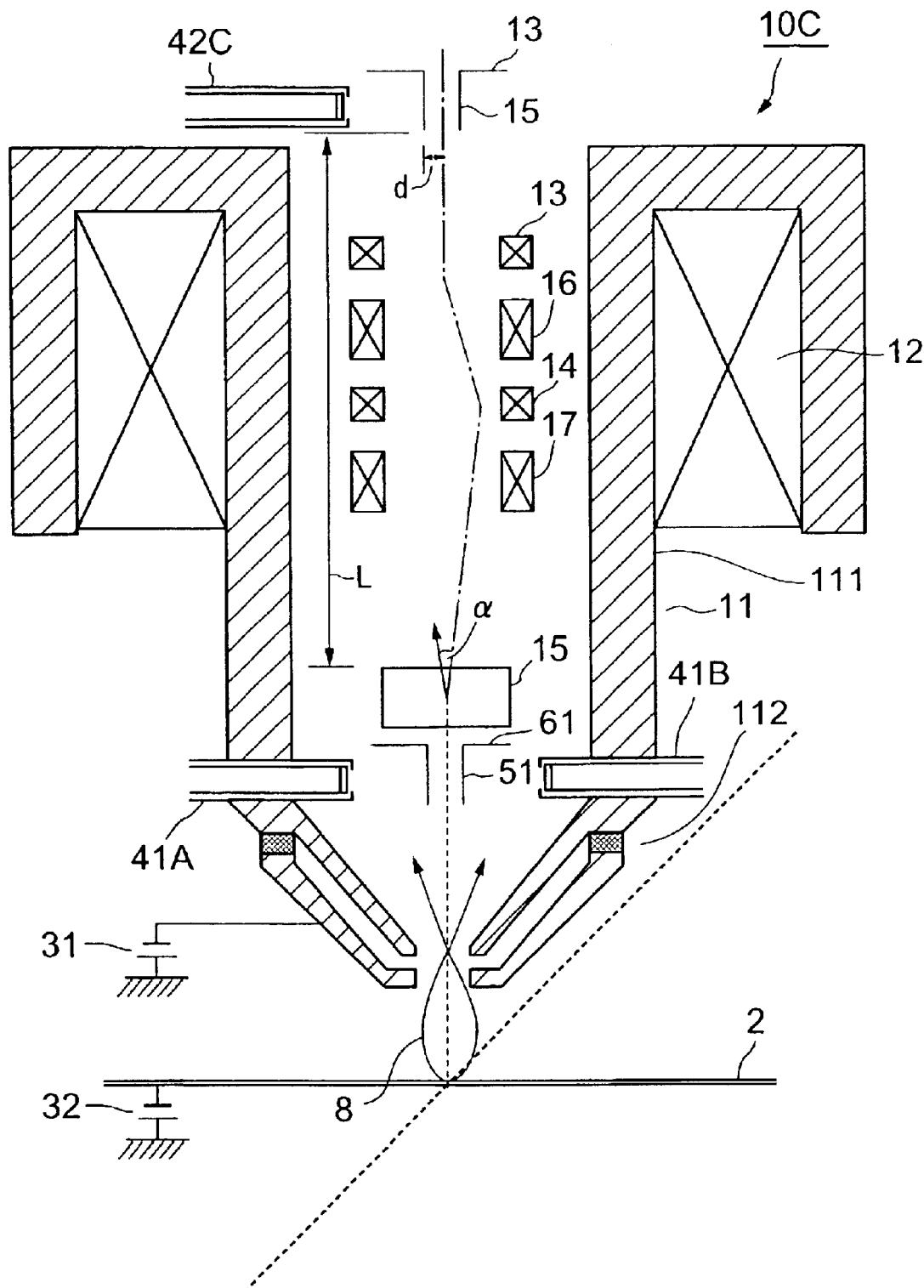
FIG. 6 is a cross-sectional view of another embodiment of a single pole-piece lens with an electrostatic bipotential lens of the present invention.

FIG. 6 shows another embodiment of a single pole-piece lens with an electrostatic bipotential lens of the present invention. A single pole-piece lens with an electrostatic bipotential lens 10C shown in FIG. 6 differs from the single pole-piece lens with an electrostatic bipotential lens 10B shown in FIG. 5 in that a second detector 42C, second cylinder 52C and second reflecting plate 62C are provided on the side of the electron source from the deflectors 13 and 14 and the scanning deflectors 16 and 17. The same numerals are used for the sections in FIG. 6, that correspond to those in FIG. 5, and the descriptions for those sections are omitted.

According to this embodiment, a distance L between the second detector 42C and the deflector 15 becomes large and an angle of deflection $\alpha$ of the secondary electrons 8 therefore becomes small because the second detector 42C, the second cylinder 52C and the second reflecting plate 62C are placed on the side of the electron source from the deflectors 13 and 14 and the scanning deflectors 16 and 17. The amount of deflection at the second cylinder 52C is therefore $d = L \tan \alpha$. The angle $\alpha$ can therefore be made small to obtain the same value for d as for the case where the distance L is small. The strength of the deflector 15 can therefore be made small and detrimental effects on image quality can therefore be prevented.

According to the present invention, as described above, in an electron beam apparatus equipped with a magnetic field lens arranged on the same axis as an optical axis and configured in such a manner that an electron beam from an electron beam source advancing along the optical axis and being incident to the magnetic field lens focused onto a sample subjected to a negative voltage, with electrons emitted from the sample as a result of the sample being irradiated with the electron beam being detected, a conductive cylinder is arranged so as to cover part of the optical axis in such a manner as to permit the passage of an electron beam from the electron beam source, a first detector for detecting emitted electrons of the emitted electrons that do not pass through the cylinder; a second detector for detecting emitted electrons of the emitted electrons that do pass through the cylinder; and a Wien filter deflector for increasing the emitted electrons detected by the second detector for emitted electrons that pass through the cylinder, provided between the cylinder and the second detector; are provided within the magnetic field lens. It is therefore possible to make the force required to deflect the discharged electrons small, i.e. to make the electromagnetic field strength of a Wien filter deflector small, so that substantially all electrons emitted from the sample go towards the first detector and the second detector. In this way, the influence imparted upon the incident electron beam is small, it is possible to prevent image resolution from falling, the efficiency with which emitted electrons are detected is increased, and picture quality can be improved. Further, the same extent of negative potential can be applied to the cylinders etc. as to the sample. This prevents detection efficiency from being reduced due to soiling of the reflecting plates.

What is claimed is:

1. In an electron beam apparatus having an optical axis, an electron beam source for generating an electron beam directed along the optical axis, and a magnetic field lens having an axis coincident with the optical axis for focusing the electron beam onto a sample subjected to a negative voltage so that secondary electrons are emitted from the sample, the magnetic field lens comprising:
   a conductive cylinder surrounding a part of the optical axis to permit the passage therethrough of an electron beam from the electron beam source;
   a reflecting elate disposed over and surrounding the conductive cylinder;
   a first detector for detecting secondary electrons emitted by the sample in a direction away from the optical axis, the first detector being disposed at a position generally confronting the conductive cylinder;
   a second detector disposed over the conductive cylinder, at least one of the first detector and the second detector comprising a scintillation detector;
   a Wien filter deflector for deflecting secondary electrons emitted by the sample toward the second detector and for detection by the second detector, the Wien filter deflector being disposed on the optical axis and between the conductive cylinder and the second detector; and
   means for applying a negative voltage to the conductive cylinder and the reflecting plate.

2. An electron beam apparatus according to claim 1; wherein a value of the negative voltage applied to the conductive cylinder and the reflecting plate is the same as that of the negative voltage applied to the sample or larger than the negative voltage applied to the sample.

3. In an electron beam apparatus having an optical axis, an electron beam source for generating an electron beam, and a magnetic field lens having an axis coincident with the optical axis for focusing the electron beam onto a sample subjected to a negative voltage so that secondary electrons are emitted from the sample, the magnetic field lens comprising:
   a first detector spaced-apart from the optical axis for detecting secondary electrons emitted from the sample;
   a second detector disposed over the first detector and spaced-apart from the optical axis for detecting secondary electrons emitted from the sample, at least one of the first detector and the second detector comprising a scintillator detector;
   a first deflector disposed on the optical axis and between the first and second detectors for deflecting secondary electrons emitted from the sample toward and for detection by the second detector;
   a pair of stages of second deflectors for deflecting the electron beam generated by the electron beam source toward the second detector so that the electron beam enters the first deflector while intersecting the optical axis at an inclination angle;
   a conductive cylinder surrounding part of the optical axis;
   a reflecting plate disposed over and surrounding the conductive cylinder; and
   means for applying a negative voltage to the conductive cylinder and the reflecting plate.

4. An electron beam apparatus according to claim 3; wherein a value of the negative voltage applied to the conductive cylinder and the reflecting plate is the same as that of the negative voltage applied to the sample or larger than the negative voltage applied to the sample.

* * * * *